United States Patent [19]
Zhou et al.

[11] Patent Number: 5,864,233
[45] Date of Patent: Jan. 26, 1999

[54] METHOD TO REDUCE EDDY CURRENT EFFECTS IN DIFFUSION-WEIGHTED ECHO PLANAR IMAGING

[75] Inventors: Xiaohong Zhou, Pewaukee; Joseph K. Maier; Hammond Glenn Reynolds, both of Milwaukee, all of Wis.

[73] Assignee: General Electric Company, Milwaukee, Wis.

[21] Appl. No.: 803,808

[22] Filed: Feb. 22, 1997

[51] Int. Cl.$^6$ .................................................. G01V 3/00
[52] U.S. Cl. .......................................... 324/309; 324/314
[58] Field of Search ................................... 324/300, 307, 324/309, 314, 318; 600/410

[56] References Cited

U.S. PATENT DOCUMENTS

| | | | |
|---|---|---|---|
| 4,965,521 | 10/1990 | Egloff ...................................... | 324/312 |
| 5,289,127 | 2/1994 | Doddrell et al. ....................... | 324/314 |
| 5,450,010 | 9/1995 | Meulen et al. ......................... | 324/309 |
| 5,455,512 | 10/1995 | Groen et al. ........................... | 324/309 |
| 5,647,362 | 7/1997 | Fuderer et al. ........................ | 324/309 |

*Primary Examiner*—John Barlow
*Assistant Examiner*—Patrick Assouad
*Attorney, Agent, or Firm*—James O. Skarsten; Christian G. Cabou; Phyllis Y. Price

[57] ABSTRACT

An eddy current correction method is provided for use in an MR system disposed to generate difflusion-weighted echo planar images by employing a bipolar diffusion-weighting gradient as well as the nominal components in an echo planar imaging pulse sequence. The correction method comprises the steps of deriving eddy current parameters (i.e., amplitude and time constant) associated with each eddy-current-induced magnetic field component caused by the diffusion-weighting gradient, and generating a set of correction terms, each of the correction terms being a function of the parameters. The method includes the further steps of modifyg a set of ideal echo planar imaging gradients and the receiver phase and frequency to respectively offset the eddy current induced magnetic field gradient and the spatially independent $B_0$-magnetic field. The modification occurs in two stages. Prior to data acquisition, errors are exactly corrected by altering the pre-phasing and the slice-refocusing gradient areas as well as the initial receiver phase. During data acquisition, the eddy current induced errors are approximately compensated for by adding offset gradients and dynamically changing the receiver phase and frequency using either a piece-wise-constant approximation or a constant approximation. Using either method, artifacts in diffusion-weighted echo planar images can be significantly reduced.

15 Claims, 5 Drawing Sheets

5,864,233

METHOD TO REDUCE EDDY CURRENT EFFECTS IN DIFFUSION-WEIGHTED ECHO PLANAR IMAGING

BACKGROUND OF THE INVENTION

The method disclosed and claimed herein generally pertains to a magnetic resonance (MR) imaging technique known as diffusion-weighted echo planar imaging (EPI). More particularly, the invention pertains to a method for significantly reducing errors in MR images acquired in accordance with a diffusion-weighted EPI technique, wherein the errors are caused by eddy currents induced by the diffusion-weighting gradient.

As is well known to practitioners in the field of MR imaging, diffusion-weighted images can be obtained using a pair of diffusion-weighting gradients placed, for example, before and after a 180° refocusing radio-frequency (RF) pulse. With the diffusion-weighting gradient, spins with different diffusion coefficients exhibit different degrees of signal loss according to the formula $S=S_0 e^{-bD}$. In this expression, S and $S_0$ are the signals with and without the diffusion-weighting gradient, respectively, D is the diffusion coefficient for a given tissue, and b is known as "b-factor" which is proportional to the square of the diffusion-weighting gradient amplitude. In order for tissues with distinct diffusion coefficients to show adequate contrast in MR images, the amplitude of the diffusion-weighting gradient must be strong enough to ensure a sufficiently large b-factor.

Diffusion-weighted MR imaging technique is particularly useful for early detection of cerebral ischemia. Within only a few hours of the onset of a stroke, diffusion-weighted imaging can highlight the ischemic regions with excellent contrast, whereas other techniques either detect the ischemia at a much later time or cannot detect it at all. Early stroke detection is particularly important as therapeutic drugs such as TPA are effective only within a relatively narrow "therapeutic window", which typically lasts several hours. For effective stroke detection, a b-factor between 600 and 1000 s/(mm)$^2$ is frequently used, resulting in a large diffusion-weighting gradient (e.g., 2 G/cm) to be active for an extended period of time (e.g., 30 ms). Such a diffusion-weighting gradient makes the pulse sequence extremely sensitive to patient motion and eddy current effects. While the motion problem can be effectively removed using the EPI technique, the eddy current problem is aggravated in EPI and causes degrading effects including image shift, geometric distortion, and intensity reduction.

SUMMARY OF THE INVENTION

The present invention provides an eddy current correction method for use in connection with an MR system disposed to generate a diffusion-weighted EPI pulse sequence to acquire MR images, wherein the pulse sequence includes a pair of diffusion-weighting gradients placed before and after a 180° refocusing RF pulse and other components in a conventional EPI pulse sequence. The method includes the step of deriving a set of parameters respectively associated with eddy current magnetic field components which are caused by the diffusion-weighting gradient. A set of correction terms are generated from the parameters, and a set of ideal EPI gradients and the receiver frequency and phase are respectively modified in accordance with the correction terms. The modified EPI gradients as well as the receiver frequency and phase are included in the pulse sequence to acquire the MR data, so that imperfection of the acquired data set resulting from the eddy current magnetic field is substantially reduced.

OBJECTS OF THE INVENTION

An object of the invention is to provide an improved method of diffusion-weighted echo planar imaging.

Another object is to provide a method for a diffusion-weighted EPI scan which significantly reduces undesirable eddy current effects, such as shift, shear, compression (or dilation), and signal intensity loss.

Another object is to provide a method of the above type wherein the read-out, phase-encoding, and slice-selection gradients as well as the receiver frequency and phase, required for an EPI scan, are modified from the respective ideal waveforms therefor to reduce the adverse effects of the eddy currents.

These and other objects of the invention will become more readily apparent from the ensuing specification, taken together with the accompanying drawings.

DETAILED DESCRIPTION OF THE PREFERRED EMBODIMENT

Figure 1:
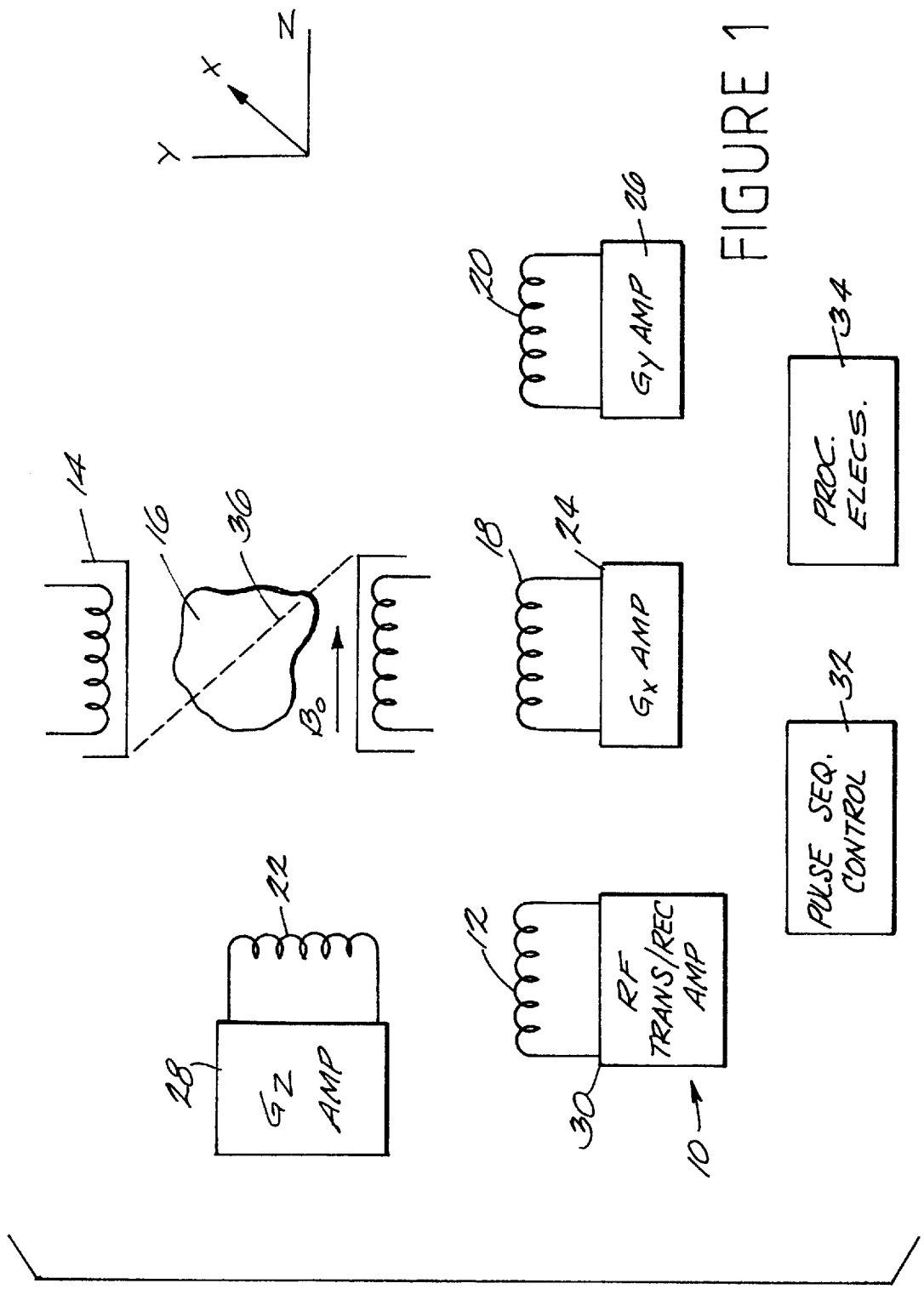
FIG. 1 is a schematic diagram showing basic components of an MR system for implementing a diffusion-weighted EPI scan in accordance with the invention.

Referring to FIG. 1, there are shown the basic components of an MR system 10 which may be operated to perform a difflusion-weighted EPI scan as described herein. System 10, in addition to an RF coil 12, includes a magnet 14 for generating a main or static magnetic field $B_0$, in the bore of a cylindrical magnet containing an imaging subject 16. System 10 further includes gradient coils 18, 20, and 22 for generating $G_x$, $G_y$, and $G_z$ magnetic field gradients relative to the orthogonal x-, y-, and z-reference axes, respectively. FIG. 1 shows each of the gradient coils 18, 20, and 22 respectively driven by amplifiers 24, 26, and 28, and RF coil 12 is coupled to transmit/receive amplifier 30. Referring further to FIG. 1, there is shown system 10 provided with a pulse sequence control 32, which is operated to control the RF and gradient amplifiers, and to thereby generate a difflusion-weighted EPI pulse sequence to produce and acquire a set of MR data. System 10 also includes image processing electronics 34 for processing the acquired MR data to construct an image of the subject 16, taken in an imaging plane 36.

The construction, functions, and interrelationships of the respective components of MR System 10 described above are well known and described in the prior art in fill detail, such as in U.S. Pat. No. 5,161,656, issued on Sep. 29, 1992 to Maier et al. Such patent is particularly directed to EPI scans, and teachings thereof are incorporated herein by reference.

Figure 2:
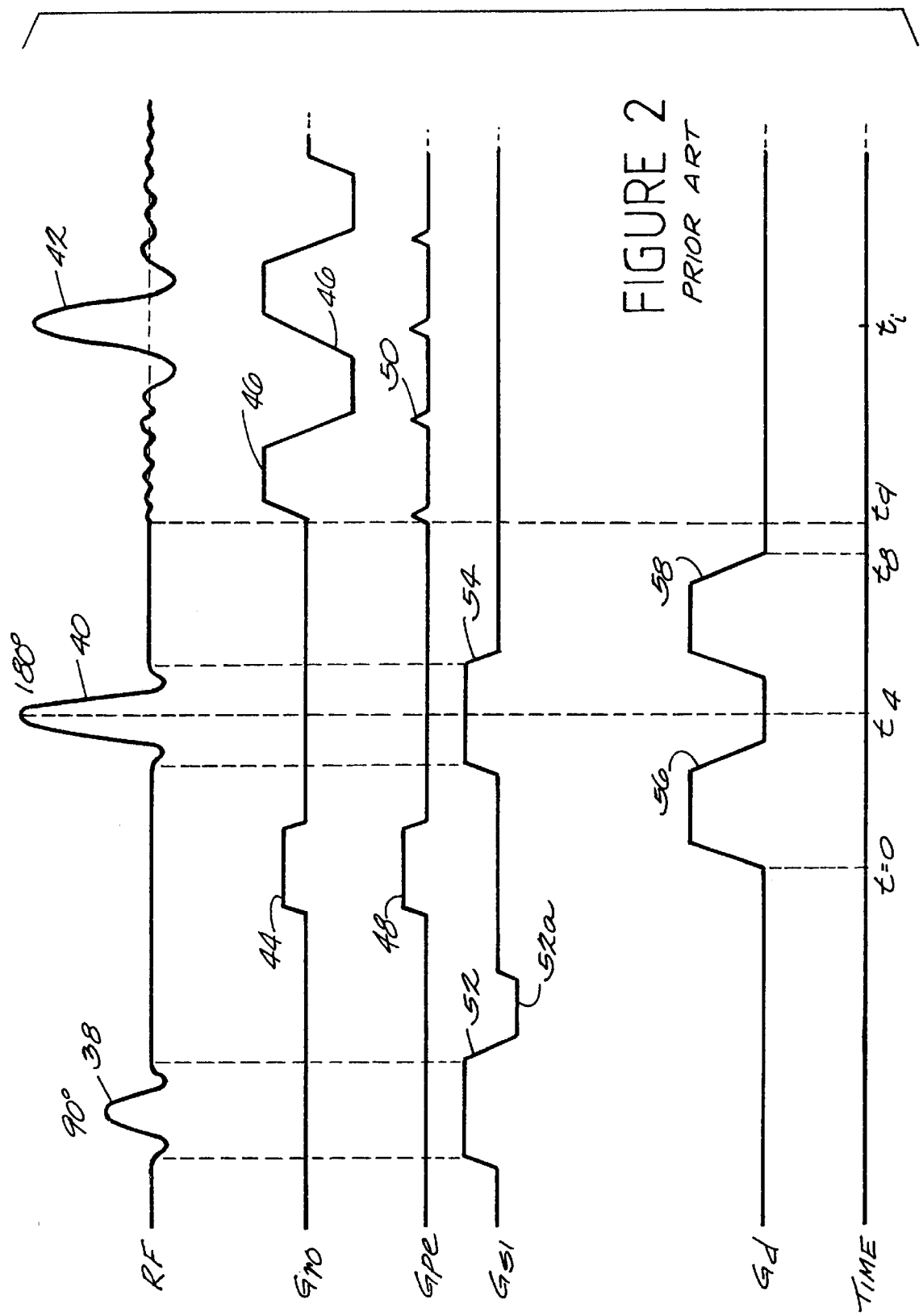
FIG. 2 is a pulse sequence diagram showing ideal gradient and RF waveforms for a difflusion-weighted EPI scan.

Referring to FIG. 2, there is shown a difflusion-weighted EPI pulse sequence including 90° and 180° RF pulses 38 and 40, respectively. The RF pulses can be transmitted by RF coil 12 to generate an echo signal 42, which can be encoded with spatial information. The echo signal can also be received by means of coil 12, for use in reconstructing an image.

To spatially encode the echo signal in accordance with echo planar imaging, the sequence shown in FIG. 2 further includes read-out, phase-encoding, and slice-selection gradients $G_{ro}$, $G_{pe}$, and $G_{sl}$, respectively. Readout gradient $G_{ro}$ comprises a pre-phasing pulse 44 and read-out pulses 46. Similarly, phase-encoding gradient $G_{pe}$ comprises a pre-phasing pulse 48 and phase-encoding pulses 50. Slice-selection gradient $G_{sl}$ comprises slice selection pulses 52 for the 90° RF pulse and 54 for the 180° RF pulse, as well as 52a for slice refocusing.

Referring further to FIG. 2, there is shown diffusion-weighting gradient $G_d$, required for a diffusion-weighted EPI scan. Diffusion-weighting gradient $G_d$ comprises two equivalent trapezoidal pulses 56 and 58, placed at either side of the 180° RF pulse.

If the imaging plane 36 shown in FIG. 1 is orthogonal to one of the reference axes and parallel to the other two reference axes, the read-out, phase-encoding, and slice-selection gradients will each lie along one of the reference physical axes, such as along the x-, y-, and z-gradient axes, respectively. Moreover, for such convention the $G_x$ gradient will exclusively comprise the read-out gradient $G_{ro}$, $G_y$ will exclusively comprise the phase-encoding gradient $G_{pe}$, and $G_z$ will exclusively comprise the slice-selection gradient $G_{sl}$. The $G_x$, $G_y$, and $G_z$ gradients, generated by gradient coils 18, 20, and 22, respectively, are hereinafter referred to as physical gradients. The $G_{ro}$, $G_{pe}$, and $G_{sl}$ gradients are hereinafter referred to as respective logical gradients.

As is well known in the art, if imaging plane 36 is in non-parallel and non-orthogonal relationship with two or all three of the reference axes, an image acquired therein is referred to as an oblique image. For an oblique scan, two or all three of the logical gradients are formed from components of two or all three of the physical gradients. The diffusion-weighting gradient $G_d$ may also be oriented along one of the references axes, or alternatively, in the more general case, comprises two or three physical gradient components.

As is known, the diffusion-weighting gradient pulses 56 and 58 generate eddy currents in conducting structures of the adjacent MR system, which in turn produce a temporally and spatially dependent magnetic field that perturbs the nominal magnetic field used in MR imaging. Such field is represented herein as $B_m(\bar{r},t)$, where m is the axis of the diffusion-weighting gradient (m can be x, y or z) and $$B_m(\bar{r},t)=b_{m0}(t)+g_{mx}(t)x+g_{my}(t)y+g_{mz}(t)z+ \ldots$$

In such expression, $b_{m0}$ is the spatially-independent eddy current field. The $g_{mx}$, $g_{my}$, and $g_{mz}$ terms can be generalized by the term $g_{mn}$, where m and n can each be x, y or z. When m and n are the same, $g_{mn}$ is known as a linear on-axis eddy current gradient field. When m and n are different, $g_{mn}$ is said to be a linear cross-term eddy current gradient field.

The above eddy current induced magnetic fields may interact with the EPI gradient fields, as well as with the $B_0$ magnetic field, and adversely effect image quality in a number of ways. First, in the presence of $b_{m0}(t)$, diffusion-weighted EPI images are shifted along the phase-encoding direction. The $b_{m0}(t)$ eddy current field also causes a relative shift between the 90° slice profile and the 180° slice profile, leading to reduced image intensity. Second, linear eddy current fields $g_{mn}(t)$ from the diffusion-weighting gradient axis to the read-out axis produce image distortion, or shear, along the phase-encoding direction. The eddy current fields can be either on-axis or cross-term, as long as the eddy current recipient axis is the read-out axis. Third, linear eddy currents from the diffusion-weighting gradient to the phase-encoding gradient lead to image compression or dilation along the phase-encoding direction, depending on the relative polarity between the eddy current gradient and the phase-encoding gradient. Fourth, linear eddy current field induced by the diffusion-weighting gradient and acting on the slice-selection gradient introduces imperfect slice refocusing, resulting in image intensity reduction.

Since the diffusion-weighting gradient has a relatively simple form, the spatially constant and linear eddy current magnetic fields ($b_{m0}(t)$ and $g_{mn}(t)$) produced by the diffusion-weighting gradient can be calculated analytically. Then, knowing $b_{m0}(t)$ and $g_{mn}(t)$, the effects of eddy currents can be compensated for in designing the pulse sequence so that images with significantly reduced artifacts can be obtained. This is the basic idea behind the eddy current correction method of the invention. In the following discussion $G_{ro}$, $G_{pe}$, and $G_{sl}$ are used to denote the ideal read-out, phase-encoding, and slice-selection gradients, respectively, i.e., the logical gradients required for an EPI scan. As stated above, the term $b_{m0}(t)$ is used to denote the time dependent eddy current $B_0$ field induced by diffusion gradient $G_d$, and $g_{mn}(t)$ is used to denote respective time dependent eddy current gradient field components, likewise induced by $G_d$. The first subscript m represents the axis of the eddy current donor (i.e., the diffusion-weighting gradient axis), while the second subscript n indicates the axis of the eddy current acceptor (i.e., the read-out, phase-encoding or slice-selection axis.)

In accordance with prior art teachings, as set forth, for example in a publication entitled, "Analytical Method for the Compensation of Eddy-Current Effects Induced by Pulsed-Magnetic Field Gradients in NMR Systems," Jehenson et al., *Journal of Magnetic Resonance*, 90, 264–278 (1990), the eddy current magnetic fields can be expressed as follows:

$$g_{mn}(t) = \sum_j \alpha_{mnj} e^{-t/\tau_{mnj}} * \frac{dG_m(t)}{dt} = \quad \text{Equation (1a)}$$

$$\sum_j \alpha_{mnj} \int_{-\infty}^{t} e^{-(t-t')/\tau_{mnj}} \left[ \frac{dG_m(t')}{dt'} \right] dt',$$

$$b_{m0}(t) = \sum_j \alpha_{m0j} e^{-t/\tau_{m0j}} * \frac{dG_m(t)}{dt} = \quad \text{Equation (1b)}$$

$$\sum_j \alpha_{m0j} \int_{-\infty}^{t} e^{-(t-t')/\tau_{m0j}} \left[ \frac{dG_m(t')}{dt'} \right] dt'.$$

In Equation 1, m is the physical axis of the applied diffusion-weighting gradient, and can be x, y, or z, according to whether the time varying diffusion gradient $G_d$ has a component directed along the x, y, or z-axis. n is the axis of the affected spatial-encoding gradient, and may likewise be x, y, or z. The quantities $\alpha_{mnj}$ and $\tau_{mnj}$ are amplitude and time constant, respectively, of thejth linear eddy current component induced by the diffusion-weighting gradient $G_m(t)$ in adjacent structures of the MR systems. Similarly, $\alpha_{m0j}$ and $\tau_{m0j}$ are amplitude and time constant, respectively of the jth $B_0$-eddy current component that affects the main magnetic field. It was previously discovered that each such eddy current component can be empirically measured for any given MR system. A technique for determining the respective values of $\alpha_{mnj}$, $\alpha_{m0j}$, $\tau_{mnj}$, and $\tau_{m00}$ coefficients for a given applied gradient $G_m(t)$ is known in the prior art, and is described, for example, in U.S. Pat. No. 4,698,591, issued on Jan. 3, 1986 to Glover et al.

Figure 3:
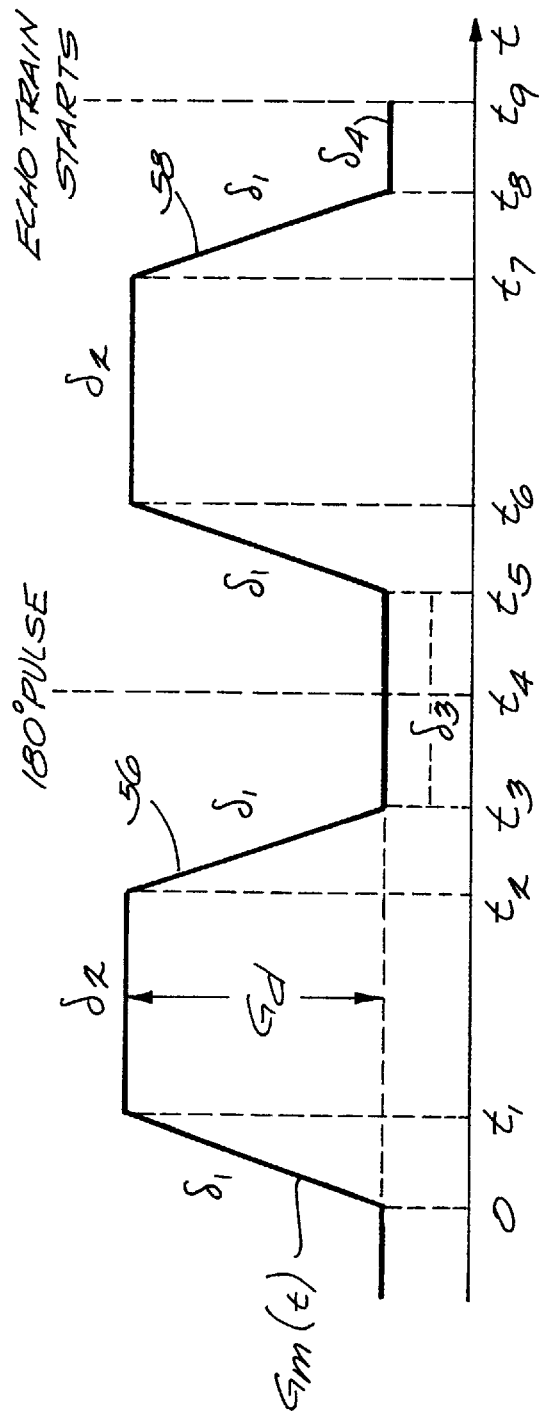
FIG. 3 shows in greater detail the diffusion-weighting gradient shown in FIG. 2, with the timing parameters to be used in the forthcoming discussions.

Referring to FIG. 3, there is shown, in greater detail, the diffusion-weighting gradient pulses 56 and 58 which comprise the applied gradient $G_m(t)$. The pulses commence at time 0 and end at time $t_8$. FIG. 3 shows that gradient $G_m(t)$ is at maximum amplitude during time periods $\delta_2$, between times $t_1$ and $t_2$, and also between times $t_6$ and $t_7$. The applied gradient is at a zero amplitude between $-\infty$ and time 0, between time $t_8$ and $+\infty$, and during a time period $\delta_3$, between times $t_3$ and $t_5$, which separates pulse 58 from pulse 56. Gradient $G_m(t)$ is increasing during the time periods $\delta_1$, between times 0 and $t_1$, and also between times $t_5$ and $t_6$, at a slew rate R, $(R=G_d/t_1)$. The gradient $G_m(t)$ is decreasing during the $\delta_1$ time periods between times $t_2$ and $t_3$, and also between times $t_7$ and $t_8$, at a slew rate $-R$.

From the time relationship of the diffusion-weighting gradient $G_m(t)$ shown in FIG. 3, the time derivative thereof is readily seen to be the following:

$$\frac{dG_m(t')}{dt'} = \begin{cases} 0 & t' \in (-\infty, 0], \text{ or } (t_1,t_2], \text{ or } (t_3,t_5] \\ & \text{ or } (t_6,t_7], \text{ or } (t_8,+\infty) \\ R & t' \in (0,t_1], \text{ or } (t_5,t_6] \\ -R & t' \in (t_2,t_3], \text{ or } (t_7,t_8] \end{cases} \quad \text{Equation (2)}$$

By combining Equations (1a) and (2), the eddy current gradient $g_{mn}(t)$ resulting from the cumulative effects of eddy current components can be expressed as:

$$g_{mn}(t) = \begin{cases} 0 & t \in (-\infty,0) \\ \sum_j a_j R \tau_j (1 - e^{-t/\tau_j}) & t \in [0,t_1) \\ \sum_j a_j R \tau_j (e^{t_1/\tau_j} - 1) e^{-t/\tau_j} & t \in [t_1,t_2) \\ \sum_j a_j R \tau_j (e^{t_1/\tau_j} - 1 - e^{t/\tau_j} + e^{t_2/\tau_j}) e^{-t/\tau_j} & t \in [t_2,t_3) \\ \sum_j a_j R \tau_j (e^{t_1/\tau_j} - 1 - e^{t_3/\tau_j} + e^{t_2/\tau_j}) e^{-t/\tau_j} & t \in [t_3,t_5) \\ \sum_j a_j R \tau_j (e^{t_1/\tau_j} - 1 - e^{t_3/\tau_j} + e^{t_2/\tau_j} + e^{t/\tau_j} - e^{t_5/\tau_j}) e^{-t/\tau_j} & t \in [t_5,t_6) \\ \sum_j a_j R \tau_j (e^{t_1/\tau_j} - 1 - e^{t_3/\tau_j} + e^{t_2/\tau_j} + e^{t_6/\tau_j} - e^{t_5/\tau_j}) e^{-t/\tau_j} & t \in [t_6,t_7) \\ \sum_j a_j R \tau_j (e^{t_1/\tau_j} - 1 - e^{t_3/\tau_j} + e^{t_2/\tau_j} + e^{t_6/\tau_j} - e^{t_5/\tau_j} - e^{t/\tau_j} - e^{t_7/\tau_j}) e^{-t/\tau_j} & t \in [t_7,t_8) \\ \sum_j a_j R \tau_j (e^{t_1/\tau_j} - 1 - e^{t_3/\tau_j} + e^{t_2/\tau_j} + e^{t_6/\tau_j} - e^{t_5/\tau_j} - e^{t_8/\tau_j} - e^{t_7/\tau_j}) e^{-t/\tau_j} & t \in [t_8,\infty) \end{cases}$$

Equation (3)

It is to be noted that on the right side of the expression shown in Equation (3), the mn subscripts have been deleted for simplicity.

In providing compensation for the eddy current gradient $g_{mn}(t)$ it is useful to consider k-space errors $\Delta k_{mn}$ resulting therefrom. If $\Delta k_{mni}$ is the k-space error at time $t_i$, as shown by FIG. 2, then $$\Delta k_{mni} = \gamma \int_0^{t_1} g_{mn}(t) dt.$$

Such expression for $\Delta k_{mni}$ can alternatively be stated as follows:

$$\Delta k_{mni} = \gamma \int_0^{t_9} g_{mn}(t) dt + \gamma \int_{t_9}^{t_1} g_{mn}(t) dt. \quad \text{Equation (4)}$$

Let $$\Delta k_{mno} = \gamma \int_0^{t_9} g_{mn}(t) dt, \text{ and } \Delta k'_{mni} = \gamma \int_{t_9}^{t_i} g_{mn}(t) dt.$$

Therefore, $$\Delta k_{mni} = \Delta k_{mn0} + \Delta k'_{mni}.$$

Referring to FIGS. 2 and 3 together, it is seen that acquisition of MR data does not commence until after time $t_9$. Thus, $\Delta k_{mn0}$ is referred to as a pre-acquisition error whereas $\Delta k'_{mni}$ is called an acquisition error. While acquisition error $\Delta k'_{mni}$ is time-dependent, pre-acquisition error $\Delta k_{mn0}$ is not, and stays constant during the k-space data acquisition.

Because of the phase reversal effect of the 180° RF pulse, the k-space error produced by the first gradient lobe prior to the 180° pulse (i.e., $0 \leq t \leq t_4$) is going to be canceled by the second gradient lobe during the time interval between $t_5$ and $t_5+t_4$. Therefore, to determine the net pre-acquisition k-space error, $\Delta k_{mn0}$, it is only necessary to consider the first diffusion-weighting gradient lobe from $t_4$ to $t_9$ and the second gradient lobe from $t_5+t_4$ to $t_9$, that is:

$$\Delta k_{mn0} = \gamma \int_{t_4}^{t_9} g_I(t) dt + \gamma \int_{t_5+t_4}^{t_9} g_{II}(t') dt', \quad \text{Equation (5)}$$

where, from Equation (3), $$g_I(t) = \sum_j \alpha_j R \tau_j (e^{t1/\tau j} - 1 - e^{t3/\tau j} + e^{t2/\tau j}) e^{-t/\tau j},$$

$$g_{II}(t') = \sum_j \alpha_j R \tau_j (e^{t1\tau j} - 1 - e^{t3/\tau j} + e^{t2/\tau j}) e^{-t'/\tau j}.$$

After carrying out the integration in Equation (5) the following is obtained:

$$\Delta k_{mn0} = \qquad \text{Equation (6)}$$

$$\gamma \sum_j \alpha_j R \tau_j^2 (1 - e^{t1/\tau j})(1 - e^{t2/\tau j})[2e^{-t4/\tau j} - e^{-t9/\tau j} - e^{-(t3+\delta 4)/\tau j}].$$

In the above equations, the subscripts mn are again deleted from the right side of the respective expressions for simplicity.

If the diffusion-weighting gradient has a component applied along the x-axis, and if the read-out, phase-encoding, and slice-selection gradients are respectively applied along the x-, y-, and z-axes, the k-space pre-acquisition errors respectively corresponding thereto may be readily determined from Equation (6), and comprise the following:

$$\text{read-out k-space offset: } k_{xx0} = \gamma \sum_j \alpha_{xxj} R \tau_{xxj}^2 \lambda(\tau_{xxj}), \qquad \text{Equation (7)}$$

$$\text{phase-encoding k-space offset: } k_{xy0} = \gamma \sum_j \alpha_{xyj} R \tau_{xyj}^2 \lambda(\tau_{xyj}), \qquad \text{Equation (8)}$$

$$\text{slice-selection k-space offset: } k_{xz0} = \gamma \sum_j \alpha_{xzj} R \tau_{xzj}^2 \lambda(\tau_{xzj}), \qquad \text{Equation (9)}$$

where $$\lambda(\tau) = (1 - e^{t1/\tau})(1 - e^{S2/\tau})[2e^{-t4/\tau} - e^{-t9/\tau} - e^{-(t3+\delta 4)/\tau}].$$

In Equations (7)–(9), the R, α, and τ terms respectively represent the same quantities as in Equations (1) and (2). Equations (7)–(9) also include timing parameters which are shown in FIG. 3. It will be readily appreciated that other k-space pre-acquisition errors will be derived for other values of m and n, which will occur, for example, when the diffusion-weighting gradient is applied along the y- or z-axis, or when the diffusion-weighting gradient has components along these physical axes.

As stated above, the static $B_0$ field is affected by the eddy current induced magnetic field $b_{m0}(t)$. Such component may be readily determined as a function of $G_m(t)$ and α and τ coefficients from Equation (1b). When Equation (1b) is combined with Equation (2), an expression for $B_0$ field error can be derived. Similar to the case that a gradient error produces a k-space error, $b_{m0}(t)$ generates a phase error $\emptyset_{m0}(t)$ in the MR signals. This phase error can also be divided into a time-independent pre-acquisition error $\emptyset_{m00}$, and a time-dependent acquisition error $\emptyset'_{m0}(t)$: $\emptyset_{m0}(t) = \emptyset_{m00} + \emptyset'_{m0}(t)$. For a diffusion-weighting gradient applied along the x-axis, the pre-acquisition phase error is given by:

$$\phi_{x0} = \gamma \sum_j \alpha_{x0j} R \tau_{x0j}^2 \lambda(\tau_{x0j}). \qquad \text{Equation (10)}$$

Similarly, the pre-acquisition phase errors corresponding to the diffusion-weighting gradient along the physical y or z-axis can also be obtained.

The constant pre-acquisition k-space offsets respectively set forth in Equations (7)–(9) can be precisely removed by modifying the pre-phasing pulses 44 and 48, in the read-out and phase-encoding directions, respectively, and the refocusing pulse 52a in the slice-selection gradient direction. For example, if the original amplitude of a pre-phasing pulse or a refocusing gradient is taken to be $G_{pp}$, the pulse width thereof is T, and the waveform thereof is defined by a dimensionless function ψ(t), the amplitude of such pre-phasing pulse or refocusing pulse may be modified to a new value given by Equation 11:

$$G'_{pp} = \frac{\gamma G_{pp} \int_0^T \psi(t)dt - k_{mn0}}{\gamma \int_0^T \psi(t)dt}, \qquad \text{Equation (11)}$$

Once again, the subscripts m and n can be either x, y, or z, depending on which axis the diffusion-weighting gradient is applied to, and which axis the acquisition correction is targeted for. Alternatively, the pre-phasing or refocusing gradient pulse can be modified by changing the pulse width T, provided that the gradient-time area of the modified pulse equals the area of the original pulse, minus $k_{mn0}/\gamma$.

The constant phase offset $\emptyset_{m00}$ can be removed by adjusting the phase of the MR system receiver, or can alternatively be left alone since it does not affect the magnitude of the MR images.

For a diffusion-weighting gradient applied along the x-axis, and for read-out, phase-encoding, and slice-selection gradients respectively directed along the x-,y-, and z-axes, expressions for acquisition errors can be derived from Equations (1a), (1b) and (3) as follows:

$$B_0 \text{ field: } b_{x0}(t) = \sum_j \alpha_{x0j} R \tau_{x0j} C(\tau_{x0j}) e^{-t/\tau_{x0j}} \qquad \text{Equation (12)}$$

$$\text{read-out gradient: } g_{xx}(t) = \sum_j \alpha_{xxj} R \tau_{xxj} C(\tau_{xxj}) e^{-t/\tau_{xxj}} \qquad \text{Equation (13)}$$

$$\text{phase-encoding gradient: } g_{xy}(t) = \sum_j \alpha_{xyj} R \tau_{xyj} C(\tau_{xyj}) e^{-t/\tau_{xyj}} \qquad \text{Equation (14)}$$

$$\text{slice-selection gradient: } g_{xz}(t) = \sum_j \alpha_{xzj} R \tau_{xzj} C(\tau_{xzj}) e^{-t/\tau_{xzj}} \qquad \text{Equation (15)}$$

where $$C(\tau) = (e^{t1/\tau} - 1 - e^{t3/\tau} + e^{t2/\tau} + e^{t6/\tau} - e^{t5/\tau} - e^{t8/\tau} + e^{t7/\tau})$$

Correction of the above acquisition errors is more difficult than the pre-acquisition errors because of the time dependence. Accurate compensation would only be possible by dynamically adjusting the logical gradients and receiver frequency on a point-by-point basis during the entire EPI read-out train. Such solution introduces profound complexity in pulse sequence programming.

Figure 4:
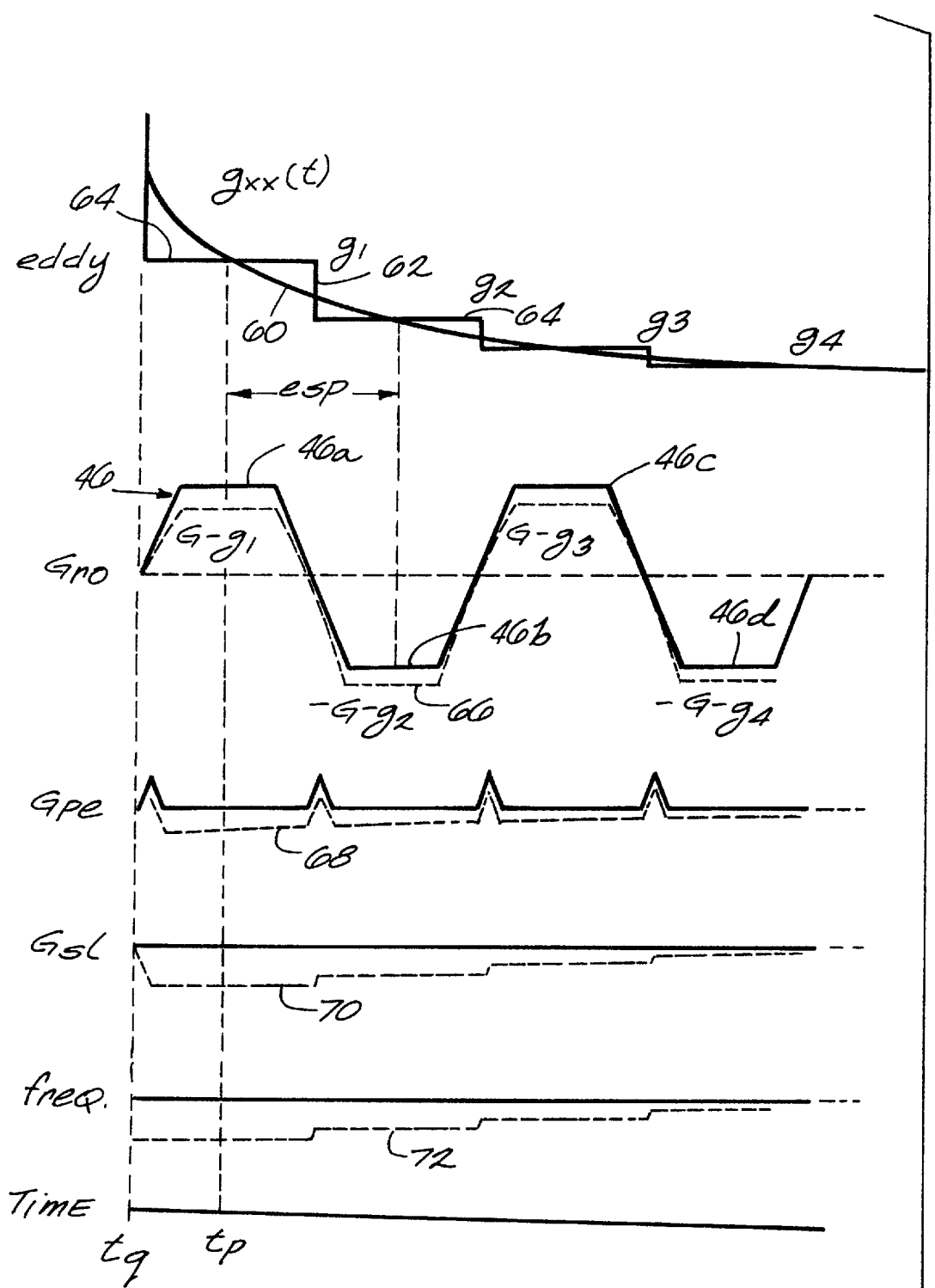
FIG. 4 shows a portion of waveforms shown in FIG. 2, which have been modified in accordance with a first embodiment of the invention.

In an eddy current correction approach which has proved to be comparatively simple yet effective, multi-exponential decay curve 60 for a generalized eddy current $g_{mn}(t)$, as shown in FIG. 4, is approximated by means of a piece-wise constant gradient 62. For example, if the decay curve depicts read-out gradient acquisition error $g_{xx}(t)$, as set forth in Equation (13), gradient approximation 62 comprises segments 64. Each segment 64 corresponds to one of the read-out gradient pulses 46, and has a time length equal to esp, where esp is the inter-echo spacing of the read-out gradient, i.e., the spacing between adjacent read-out pulses 46a and 46b shown in FIG. 4. The amplitude of each segment 64 is deterinied from $g_{xx}(t)$, in accordance with Equation (13), at the midpoint $t_p$ of the read-out pulse corresponding to the segment 64. Thus, the amplitudes of segments 64 respectively corresponding to pulses 46a–d comprise $g_1$–$g_4$ as shown in FIG. 4. To compensate for the eddy current effects represented by curve 60, the ideal read-out gradient waveform is modified by subtracting the amplitude of each segment 64 from its corresponding read-out gradient pulse. The modified read-out gradient is depicted as a dashed line 66 having pulse amplitude such as G-g$_1$ and -G-g$_2$, where G and -G are the respective amplitudes of the ideal gradient pulses 46a and 46b.

Implementation of the above piece-wise constant procedure for the phase-encoding and slice-selection gradients is much easier, because the original gradients are either unipolar or non-existent. Referring further to FIG. 4, there is shown curve 68 comprising a phase-encoding waveform which is modified from an ideal phase-encoding waveform in accordance with the above compensation method and Equation (14). Similarly, curve 70 shows modified slice-selection waveform in accordance with the above compensation method and Equation (15).

To compensate for the B$_0$ acquisition error, the receiver phase must be adjusted for different echoes and the receiver frequency must be changed for each echo acquisition. The receiver phase offset can be calculated at the center of each acquisition window using the following equation:

$$\phi_{x0}(l) = \gamma \sum_j \alpha_{x0j} R \tau_{x0j}^2 (1 - e^{t_1/\tau_{x0j}})(1 - e^{t_2/\tau_{x0j}})[2e^{-t_4/\tau_{x0j}} - e^{-t_l/\tau_{x0j}} - e^{-(t_3+\delta_4)/\tau_{x0j}}]$$

Equation (16)

where l is the lth echo and t$_1$ is the time at the center of the lth echo. The frequency offset $\Delta f_{x0}(t)$ can be directly obtained from Equations (12) and (17):

$$\Delta f_{x0}(t) = \frac{\gamma}{2\pi} b_{x0}(t), \text{ with } t = t_1.$$

Equation (17)

The frequency modification 72 is shown in FIG. 4.

Figure 5:
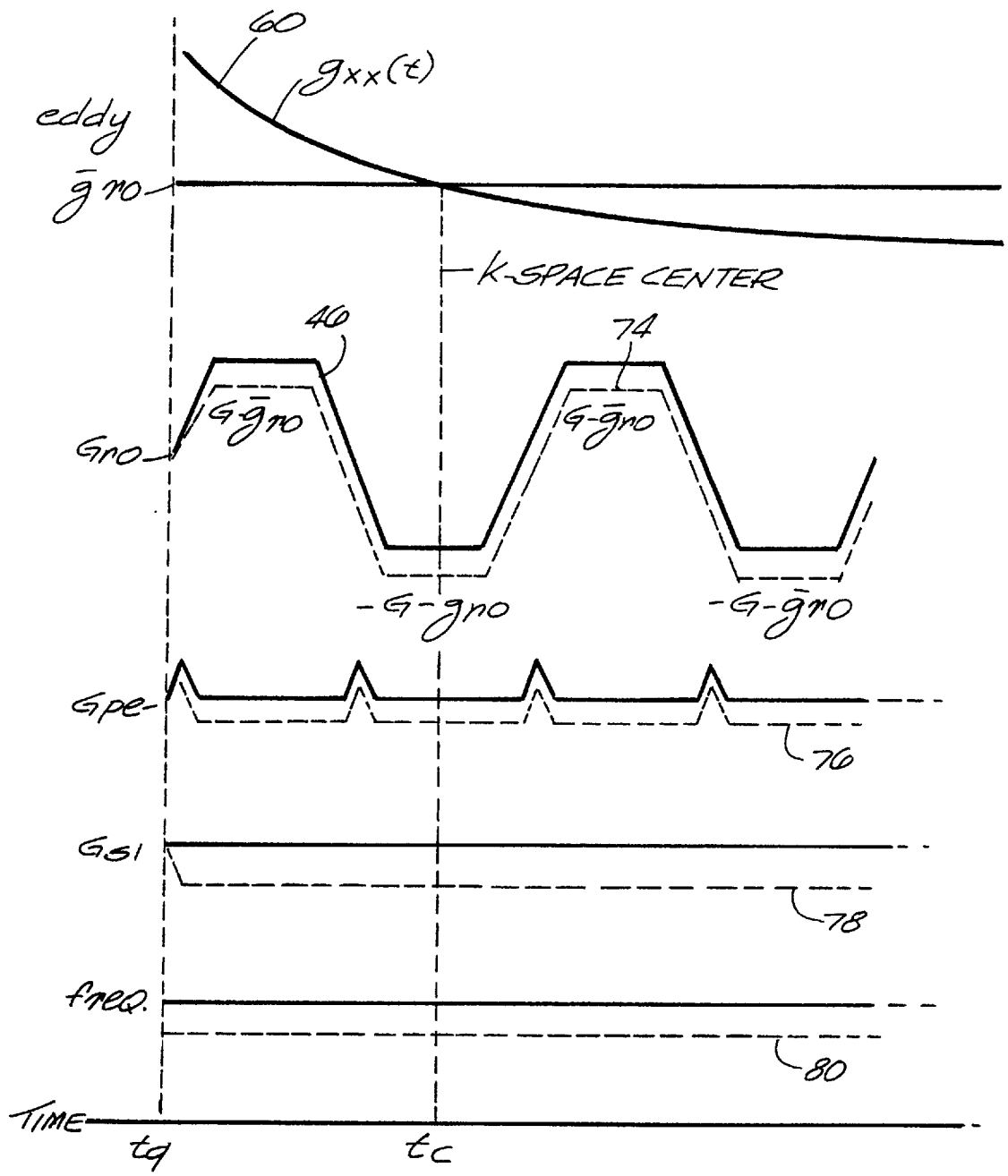
FIG. 5 shows a portion of waveforms shown in FIG. 2 which have been modified in accordance with a second embodiment of the invention.

Referring to FIG. 5, there is shown a second method of correcting eddy current effects during the data acquisition period. Such method has been found to be significantly simpler than the piece-wise approximation method of FIG. 4 and yet still provides adequate eddy current correction. FIG. 5 again shows decay curve 60 representing eddy current component g$_{xx}$(t) during data acquisition. In addition, FIG. 5 shows t$_c$, which is the time point when the central k-space data are acquired. For read-out gradient correction, a mean gradient compensation value $\bar{g}_{ro}$ is computed from Equation (13) at time t$_c$. Such mean compensation value is used to modify the ideal read-out gradient, as shown by dashed curve 74 of FIG. 5.

Referring further to FIG. 5, there is shown modified phase-encoding waveform 76, slice-selection waveform 78, and frequency waveform 80, comprising modified gradient compensation values in accordance with the method described above. Such values were respectively computed from Equations (14), (15) and (17) at time t$_c$.

Although the above discussion has assumed that the diffusion-weighting gradient is applied along the physical x-axis, the eddy current correction methods using either piece-wise constant approximation or a constant approximation can be readily generalized to account for the diffusion-weighting gradient in any physical axes.

In some applications, the diffusion-weighting gradient G$_d$ can be applied in any arbitrary direction to study the tissue diffusion anisotropy. The present correction method can be extended to apply to this general case. Let the diffusion gradient G$_d$ be applied in an arbitrary direction with respect to the three logical gradient axes: ro, pe, and sl. In this reference frame, G$_d$ can be expressed by its three orthogonal components G$_{d,ro}$, G$_{d,pe}$, and G$_{d,sl}$:

$$\bar{G}_d = \begin{bmatrix} G_{d,ro} \\ G_{d,pe} \\ G_{d,sl} \end{bmatrix}$$

Equation (18)

The logical gradient components G$_{d,ro}$, G$_{d,pe}$, and G$_{d,sl}$ are related to the physical gradients by the rotation matrix R:

$$\begin{bmatrix} G_{d,x} \\ G_{d,y} \\ G_{d,z} \end{bmatrix} = \Re \begin{bmatrix} G_{d,ro} \\ G_{d,pe} \\ G_{d,sl} \end{bmatrix} = \begin{bmatrix} a_{11} & a_{12} & a_{13} \\ a_{21} & a_{22} & a_{23} \\ a_{31} & a_{32} & a_{33} \end{bmatrix} \begin{bmatrix} G_{d,ro} \\ G_{d,pe} \\ G_{d,sl} \end{bmatrix}$$

Equation (19)

Each individual physical gradient G$_{d,x}$, G$_{d,y}$ or G$_{d,z}$ can produce eddy currents that generate a B$_0$-field and three linear gradient fields, as well as the higher order spatially dependent fields as described previously. Equation (1) shows that these eddy current fields are proportional to the inducing gradient. The overall B$_0$-field produced by the G$_{d,x}$, G$_{d,y}$ and G$_{d,z}$ gradients is thus obtained as:

$$b_0 = G_{d,x}\xi_{x0} + G_{d,y}\xi_{y0} + G_{d,z}\xi_{z0} = [\xi_{x0} \quad \xi_{y0} \quad \xi_{z0}] \begin{bmatrix} G_{d,x} \\ G_{d,y} \\ G_{d,z} \end{bmatrix}$$

Equation (20)

where $\xi_{x0}$, $\xi_{y0}$, and $\xi_{z0}$ are defined as follows:

$$\xi_{m0} = \frac{1}{t_1} \sum_j a_{m0j}\tau_{m0j}\sigma_{m0j}e^{-t_c/\tau_{m0j}}$$

Equation (21)

In Equation (21), m can be x, y, or z, and $\sigma_{m0j}$ is given as:

$$\sigma_{m0j} = e^{t_1/\tau_{m0j}} - 1 - e^{t_3/\tau_{m0j}} + e^{t_2/\tau_{m0j}} + e^{t_6/\tau_{m0j}} - e^{t_5/\tau_{m0j}} - e^{t_8/\tau_{m0j}} + e^{t_7/\tau_{m0j}}$$

Equation (21a)

Similarly, the eddy current-induced gradient fields are obtained as:

$$g_x = G_{d,x}\xi_{xx} + G_{d,y}\xi_{yx} + G_{d,z}\xi_{zx}$$
$$g_y = G_{d,x}\xi_{xy} + G_{d,y}\xi_{yy} + G_{d,z}\xi_{zy}$$
$$g_z = G_{d,x}\xi_{xz} + G_{d,y}\xi_{yz} + G_{d,z}\xi_{zz}$$

or, in the matrix format, $$\begin{bmatrix} g_x \\ g_y \\ g_z \end{bmatrix} = \xi \begin{bmatrix} G_{d,x} \\ G_{d,y} \\ G_{d,z} \end{bmatrix} = \begin{bmatrix} \xi_{xx} & \xi_{yx} & \xi_{zx} \\ \xi_{xy} & \xi_{yy} & \xi_{zy} \\ \xi_{xz} & \xi_{yz} & \xi_{zz} \end{bmatrix} \begin{bmatrix} G_{d,x} \\ G_{d,y} \\ G_{d,z} \end{bmatrix}$$

Equation (22)

where $\xi_{mn}$ for Equation (22) is defined as follows:

$$\xi_{mn} = \frac{1}{t_1} \sum_j a_{mnj}\tau_{mnj}\sigma_{mnj}e^{-t_c/\tau_{mnj}}$$

Equation (23)

In Equation (23) m and n can be x, y, or z, and $\sigma_{mnj}$ is given by:

$$\sigma_{mnj} = e^{t_1/\tau_{mnj}} - 1 - e^{t_3/\tau_{mnj}} + e^{t_2/\tau_{mnj}} + e^{t_6/\tau_{mnj}} - e^{t_5/\tau_{mnj}} - e^{t_8/\tau_{mnj}} + e^{t_7/\tau_{mnj}}$$

Equation (23a)

From Equations (19) and (20), the frequency compensation value to be used during the data acquisition can be readily derived:

$$\Delta f = \frac{\gamma}{2\pi} [\xi_{x0} \quad \xi_{y0} \quad \xi_{z0}] \begin{bmatrix} a_{11} & a_{12} & a_{13} \\ a_{21} & a_{22} & a_{23} \\ a_{31} & a_{32} & a_{33} \end{bmatrix} \begin{bmatrix} G_{d,ro} \\ G_{d,pe} \\ G_{d,sl} \end{bmatrix}$$

Equation (24)

where $\gamma$ is the gyromagnetic ratio in rad/(gauss sec). Derivation of the gradient compensation parameters during acquisition is only slightly more complicated. Since the correction method compensates for the eddy current gradients at the logical gradient level, the physical eddy current gradients $g_x$, $g_y$, and $g_z$ in Eq. (22) must be converted to the logical gradients. This can be accomplished using the inverse of the rotation matrix, $R^{-1}$. Recogniizing that $R^{-1}$ the same as $R^+$ (the transpose of R), for the unitary rotation matrix, the following is obtained:

$$\begin{bmatrix} g_{ro} \\ g_{pe} \\ g_{sl} \end{bmatrix} = \Re^{-1} \begin{bmatrix} g_x \\ g_y \\ g_z \end{bmatrix} = \Re^{\dagger} \begin{bmatrix} g_x \\ g_y \\ g_z \end{bmatrix} = \begin{bmatrix} a_{11} & a_{21} & a_{31} \\ a_{11} & a_{22} & a_{32} \\ a_{13} & a_{23} & a_{33} \end{bmatrix} \begin{bmatrix} g_x \\ g_y \\ g_z \end{bmatrix} \quad \text{Equation (25)}$$

Combining Eqs. (19), (22) and (25), the conversion formula for the gradient compensation parameters during the echo train acquisition is derived as follows:

$$\begin{bmatrix} g_{ro} \\ g_{pe} \\ g_{sl} \end{bmatrix} = \begin{bmatrix} a_{11} & a_{21} & a_{31} \\ a_{12} & a_{22} & a_{32} \\ a_{13} & a_{23} & a_{33} \end{bmatrix} \begin{bmatrix} \xi_{xx} & \xi_{yx} & \xi_{zx} \\ \xi_{xy} & \xi_{yy} & \xi_{zy} \\ \xi_{xz} & \xi_{yz} & \xi_{zz} \end{bmatrix} \begin{bmatrix} a_{11} & a_{12} & a_{13} \\ a_{21} & a_{22} & a_{23} \\ a_{31} & a_{32} & a_{33} \end{bmatrix} \begin{bmatrix} G_{d,ro} \\ G_{d,pe} \\ G_{d,sl} \end{bmatrix} = \Re^{+}\xi\Re \begin{bmatrix} G_{d,ro} \\ G_{d,pe} \\ G_{d,sl} \end{bmatrix} \quad \text{Equation (26)}$$

Using exactly the same procedure, the pre-acquisition compensation parameters in the k-space can also be derived:

$$\begin{bmatrix} \Delta k_{ro} \\ \Delta k_{pe} \\ \Delta k_{sl} \end{bmatrix} = \begin{bmatrix} a_{11} & a_{21} & a_{31} \\ a_{12} & a_{22} & a_{32} \\ a_{13} & a_{23} & a_{33} \end{bmatrix} \begin{bmatrix} \eta_{xx} & \eta_{yx} & \eta_{zx} \\ \eta_{xy} & \eta_{yy} & \eta_{zy} \\ \eta_{xz} & \eta_{yz} & \eta_{zz} \end{bmatrix} \begin{bmatrix} a_{11} & a_{12} & a_{13} \\ a_{21} & a_{22} & a_{23} \\ a_{31} & a_{32} & a_{33} \end{bmatrix} \begin{bmatrix} G_{d,ro} \\ G_{d,pe} \\ G_{d,sl} \end{bmatrix} = \Re^{\dagger}\eta\Re \begin{bmatrix} G_{d,ro} \\ G_{d,pe} \\ G_{d,sl} \end{bmatrix}, \quad \text{Equation (27)}$$

where $\eta_{mn}$ is defined as follows:

$$\eta_{mn} = \frac{\gamma}{t_1} \sum_j \{\alpha_{mnj}\tau_{mnj}^2(1 - e^{t_1/\tau_{mnj}})(1 - e^{t_2/\tau_{mnj}})[2e^{-t_4/\tau_{mnj}} - e^{-t_9/\tau_{mnj}} - e^{-(t_3+\delta_4)/\tau_{mnj}}]\} \quad \text{Equation (28)}$$

Similarly, the phase compensation parameter is given as:

$$\Delta\phi = [\eta_{x0} \; \eta_{y0} \; \eta_{z0}] \begin{bmatrix} a_{11} & a_{12} & a_{13} \\ a_{21} & a_{22} & a_{23} \\ a_{31} & a_{32} & a_{33} \end{bmatrix} \begin{bmatrix} G_{d,ro} \\ G_{d,pe} \\ G_{d,sl} \end{bmatrix} \quad \text{Equation (29)}$$

where $\eta_{m0}$ is defined by equation (28) with "n" being replaced by "0".

At this point, the equations to convert an arbitrary diffusion-weighting gradient (i.e., arbitrary orientation and arbitrary amplitude) to the pre-acquisition (Equations (27) and (29)) and acquisition (Equations (24) and (26)) compensation parameters have been derived. Those errors can be compensated for in the pulse sequence using the aforementioned methods.

Obviously, many other modifications and variations of the present invention are possible in light of the above teachings. It is therefore to be understood that within the scope of the disclosed inventive concept, the invention may be practiced otherwise than as specifically described.

What is claimed is:

1. In an MR system disposed to generate an EPI pulse sequence to acquire MR images, wherein said pulse sequence includes a specified gradient and requires a number of EPI spatial encoding gradients, an eddy current correction method comprising the steps of:

deriving eddy current parameters respectively associated with eddy current magnetic fields caused by said specified gradient;

generating a set of correction terms comprising first and second correction term subsets, each of said correction terms being a function of said parameters;

selectively modifying a set of ideal EPI gradients in accordance with said correction terms, each of said ideal EPI gradients comprising a first gradient component occurring prior to acquisition of said data, and a second gradient component occurring during acquisition of said data, the first and second gradient components of a given one of said ideal gradients being modified by correction terms of said first and second subsets, respectively; and employing said modified EPI gradients as the said required EPI gradients for said pulse sequence to substantially reduce artifacts of said acquired MR data resulting from said eddy current fields.

2. The method of claim 1 wherein:

said method includes the steps of modifying the phase and frequency of the receiver of the data acquisition system of said MR system, and employing said modified phase and frequency in acquiring said MR data.

3. The method of claim 1 wherein:

each correction term of said first subset comprises a constant offset value; and each correction term of said second subset comprises a time varying function of said eddy current parameters.

4. The method of claim 3 wherein said ideal EPI gradients comprise mutually orthogonal read-out, phase-encoding, and slice selection gradients.

5. The method of claim 4 wherein:

said read-out pulses have a specified time spacing;

the cumulative affect of said eddy current components during acquisition of said MR data is represented by an exponential decay curve; and said second gradient component of said given ideal gradient is modified by a piece-wise approximation of said decay curve comprising a series of segments, each segment having a time length equal to said specified spacing and an amplitude computed from a corresponding correction term of said second subset.

6. The method of claim 4 wherein:

said given ideal gradient is modified by mean gradient value computed from a corresponding correction term of said subset at the center of the k-space of said data acquisition period.

7. The method of claim 1 wherein:

said eddy current parameters comprise respective amplitudes and time constants of said eddy current components.

8. The method of claim 1 wherein:

said pulse sequence comprises a diffusion-weighted EPI pulse sequence, and said specified gradient comprises a diffusion weighting gradient.

9. The method of claim 1 wherein:

said specified gradient comprises a bi-polar gradient.

10. In an MR system disposed to generate an EPI pulse sequence to acquire MR image data, wherein said pulse sequence includes a diffusion-weighting gradient and requires a number of EPI spatial encoding gradients, an eddy current correction method comprising the steps of:

deriving eddy current parameters respectively associated with eddy current magnetic fields caused by said diffusion-weighting gradient;

generating a set of gradient compensation components, each of said gradient compensation components being a function of said parameters;

selectively combining said gradient compensation components with ideal EPI gradient components respectively corresponding thereto to provide a set of modified EPI gradient components; and employing said modified EPI gradients as the said required EPI gradients for said pulse sequence to substantially reduce artifacts of said acquired MR data resulting from said eddy current fields.

11. The method of claim 10 wherein:

a given one of said gradient compensation components is subtracted from its corresponding ideal EPI gradient component to provide one of said modified EPI gradient components.

12. The method of claim 11 wherein:

said method includes the steps of modifying the phase and frequency of the receiver of the data acquisition system of said MR system, and employing said modified phase and frequency in acquiring said MR data.

13. The method of claim 12 wherein:

said set of gradient compensation components comprises first and second gradient compensation component subsets;

a portion of said ideal EPI gradient components comprise first ideal gradient components respectively occurring prior to acquisition of said data, and the remainder of said ideal EPI gradient components comprise second ideal gradient components respectively occurring during acquisition of said data; and gradient compensation components of said first and second subsets are combined with said first and second ideal gradient components, respectively.

14. The method of claim 13 wherein:

each gradient compensation component of said first subset comprises a constant value; and each gradient compensation component of said second subset comprises a time varying function of said eddy current parameters.

15. The method of claim 14 wherein:

said eddy current parameters comprise respective amplitudes and time constants of said eddy current components.

* * * * *